United States Patent
Cheung et al.

(10) Patent No.: US 7,240,422 B2
(45) Date of Patent: Jul. 10, 2007

(54) APPARATUS FOR SEMICONDUCTOR CHIP DETACHMENT

(75) Inventors: Yiu Ming Cheung, Mei Foo Sun Chuen (HK); Chou Kee Liu, Kowloon (HK); Ching Hong Yiu, Kowloon (HK); Chi Ming Chong, Carado Garden (HK)

(73) Assignee: ASM Assembly Automation Ltd., Hong Kong (HK)

( * ) Notice: Subject to any disclaimer, the term of this patent is extended or adjusted under 35 U.S.C. 154(b) by 223 days.

(21) Appl. No.: 10/843,826

(22) Filed: May 11, 2004

(65) Prior Publication Data

US 2005/0255673 A1 Nov. 17, 2005

(51) Int. Cl.
*B23P 19/00* (2006.01)

(52) U.S. Cl. ............................. 29/762; 29/721; 29/743; 29/832; 29/426.1; 156/584

(58) Field of Classification Search ............... 29/426.1, 29/426.3, 426.5, 559, 720, 721, 743, 762, 29/763, 832–834, 526.5; 156/344, 584; 438/113, 438/118, 460, 464, 976
See application file for complete search history.

(56) References Cited

U.S. PATENT DOCUMENTS

| | | | |
|---|---|---|---|
| 4,296,542 A * | 10/1981 | Gotman | 438/464 |
| 4,778,362 A * | 10/1988 | Hoffmann | 418/61.3 |
| 6,123,800 A | 9/2000 | Freund | |
| 6,165,310 A | 12/2000 | Freund | |
| 6,202,292 B1 | 3/2001 | Farnworth | |
| 6,290,805 B1 | 9/2001 | Freund | |
| 6,386,815 B1 | 5/2002 | Tawara | |
| 6,505,395 B1 | 1/2003 | Farnworth | |
| 6,555,418 B2 | 4/2003 | Kurosawa | |
| 6,561,743 B1 | 5/2003 | Nakatsu | |
| 6,629,553 B2 | 10/2003 | Odashima | |
| 6,658,718 B2 | 12/2003 | Farnworth | |
| 6,889,427 B2 * | 5/2005 | Yee et al. | 29/832 |

* cited by examiner

*Primary Examiner*—Minh Trinh
*Assistant Examiner*—Donghai D. Nguyen
(74) *Attorney, Agent, or Firm*—Ostrolenk, Faber, Gerb & Soffen, LLP (57) ABSTRACT

An apparatus and method is provided for detaching a semiconductor chip from an adhesive tape on which it is mounted. The apparatus comprises a platform adapted to contact the adhesive tape at a position of the chip and a retaining force generator coupled to the platform for drawing the adhesive tape in a direction away from the chip. An elevation device is projectable from the platform that is movable both laterally across a surface of the platform and vertically with respect to the platform for elevating the chip. By moving the elevation device across a width of the chip while lifting the chip, controlled lifting of the chip and propagation of delamination between the chip and the adhesive tape may be achieved.

16 Claims, 11 Drawing Sheets

SECTION A-A

SECTION A-A

SECTION A-A

APPARATUS FOR SEMICONDUCTOR CHIP DETACHMENT

FIELD OF THE INVENTION

The invention relates to a mechanism to aid in the detachment of a semiconductor die or integrated circuit chip that has been mounted on an adhesive tape during processing.

BACKGROUND AND PRIOR ART

Various apparatus have been used in the semiconductor packaging industry for detaching a semiconductor chip from an adhesive tape carrier in chip bonding or flip chip bonding processes. This detachment is usually necessary where a slice of wafer comprising a plurality of said semiconductor chips has been mounted onto an adhesive tape (such as Mylar film) for dicing, and each diced chip has to be removed from the adhesive tape and placed at a bonding location. The most commonly-used technique is implemented by using push-up pin(s) or multiple sets of push-up pin(s) together with a vacuum platform, such as disclosed in U.S. Pat. No. 6,386,815 entitled "Pick-up Apparatus for Semiconductor Chips" and U.S. Pat. No. 6,555,418 entitled "Method for Separating a Semiconductor Element in a Semiconductor Element Picking-up Device".

The first step of the detachment process generally comprises a delamination or peeling action between the semiconductor chip and the adhesive tape, which is induced by an upward force exerted by the push-up pin(s) underneath the chip and adhesive tape, reinforced by suction force from a vacuum platform holding down the adhesive tape. A disadvantage of this technique is that a strong bending moment will be induced on the semiconductor chip if the peeling action is not strong enough to overcome the interfacial adhesion. The chip will experience high compressive stress at the location(s) directly above the push-up pin(s). The chip will be susceptible to crack failure if the strain induced by this bending moment exceeds its critical strain. For very thin semiconductor chips (especially with a thickness of less than 150 microns), that can lead to a major failure of the chip detachment process.

In addition, as the size of the semiconductor chip increases, the ejector pin(s) need to move further upwards in order to allow delamination between the chip and the adhesive tape to propagate inwards into an inner portion of the chip. However, increasing the elevation height of the ejector pin(s) will increase the susceptibility of the chip to chip-crack failure. Another technique relies on the vacuum suction provided by a supporting platform, such as that disclosed in U.S. Pat. No. 6,202,292 ("Apparatus for Removing a Carrier Film from a Semiconductor Die"), U.S. Pat. No. 6,505,395 ("Apparatus and Method for Removing Carrier Tape from a Singulated Die") and U.S. Pat. No. 6,658,718 ("Method for Removing Carrier Film from a Singulated Die"). A strong vacuum suction via a suitably-structured platform tends to pull the adhesive tape away from the semiconductor chip. The chip will then be supported by the highest points of the structure and be ready for pickup. A disadvantage of this technique is that the geometry and form factor of the structure, as well as the strength of the vacuum suction provided, tend to limit the highest interfacial adhesive strength that can be overcome by this design.

Some other techniques introduce objects with various geometries such as a cylinder or bar, such as in U.S. Pat. No. 6,123,800 ("Method and Apparatus for Handling Element on an Adhesive Film"), U.S. Pat. No. 6,165,310 ("Apparatus and Method for Removing Parts from an Adhesive Film") and U.S. Pat. No. 6,290,805 ("System and Method for Using a Pick and Place Apparatus"). In other examples, a curved surface bar is used in U.S. Pat. No. 6,629,553 ("Method and System for Mounting semiconductor Device, Semiconductor Device Separating System, and Method for Fabricating IC Card") and a stepped flat plate underneath the semiconductor wafer or the chip(s) is used in U.S. Pat. No. 6,561,743 ("Pellet Picking Method and Pellet Picking Apparatus"). The lateral motion of these objects or tools (as opposed to the vertical motion of tools in traditional methods) on a vacuum platform will create a peeling action to detach the chip(s) from the adhesive tape. In some designs, instead of moving the objects, the objects are stationary but the wafer comprising semiconductor chips are moved laterally across these objects.

Generally speaking, customized tooling is needed for most of these techniques such that careful optimization of their geometries is necessary to ensure successful detachment and to avoid crack failure. The risk of crack failure will become pronounced if the thickness of the chip is reduced to below 150 microns (6 mils). Three major factors affecting the ability of the detachment process to successfully delaminate a chip are: (i) thickness of the semiconductor chip, (ii) the size of the semiconductor chip, and (iii) the adhesion strength of the adhesive tape. Therefore, the process window for successful detachment depends very much on the geometries of the toolings and limits the flexibility, efficiency and reliability of these techniques.

In another prior art method, the adhesion strength between the semiconductor chip and the adhesive tape may be reduced by UV light when a UV dicing tape is used. The adhesion strength of this tape can be reduced by more than two orders after exposure to UV light. After UV exposure the adhesive strength of this tape can be as small as approximately 10-30 gf/20 mm. One of the major concerns for all existing semiconductor chip detachment mechanisms is the small process window for a given tooling if a wafer is very thin (such as having a thickness of less than 150 microns) and/or large (such as having a width larger than 8 mm) and/or the wafer is mounted onto a adhesive tape of high adhesive strength (approximately 50 gf/20 mm). With this small process window, the process throughput and yield may not be easy to optimize, particularly in some cases where the adhesive strength of the tape is not uniform across the whole wafer. For example, it has been found that the peripheral chips around the wafer on a UV tape usually experience higher adhesivity to the UV tape than chips at the center of the wafer. Difficulty may thus be encountered when using the aforesaid prior art techniques in optimizing the process parameters to maximize throughput and yield.

SUMMARY OF THE INVENTION

It is therefore an object of the invention to provide an improved mechanism to aid in the removal of a semiconductor chip from an adhesive tape that overcomes some of the problems and avoids some of the aforesaid disadvantages of the prior art chip detachment techniques.

According to a first aspect of the invention, there is provided an apparatus for detaching a semiconductor chip from an adhesive tape on which it is mounted, comprising: a platform adapted to contact the adhesive tape at a position of the chip; a retaining force generator coupled to the platform for drawing the tape in a direction away from the chip; and an elevation device projectable from the platform that is movable both laterally across a surface of the platform and vertically with respect to the platform for elevating the chip, whereby to provide controlled lifting of the chip and propagation of delamination between the chip and the adhesive tape.

According to a second aspect of the invention, there is provided a method for detaching a semiconductor chip from an adhesive tape, comprising the steps of: generating a retaining force to draw a portion of the adhesive tape adjacent to the chip in a direction away from the chip; raising an elevation device to push against and lift the chip from the adhesive tape near one edge of the chip; moving the elevation device substantially across a width of the chip while propagating delamination between the chip and the adhesive tape; and lowering the elevation device while using said retaining force to maintain delamination between the chip and the adhesive tape.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of a preferred embodiment of an apparatus and method in accordance with the invention will now be described with reference to the accompanying drawings, in which.

DETAILED DESCRIPTION OF THE PREFERRED EMBODIMENT

Figure 1:
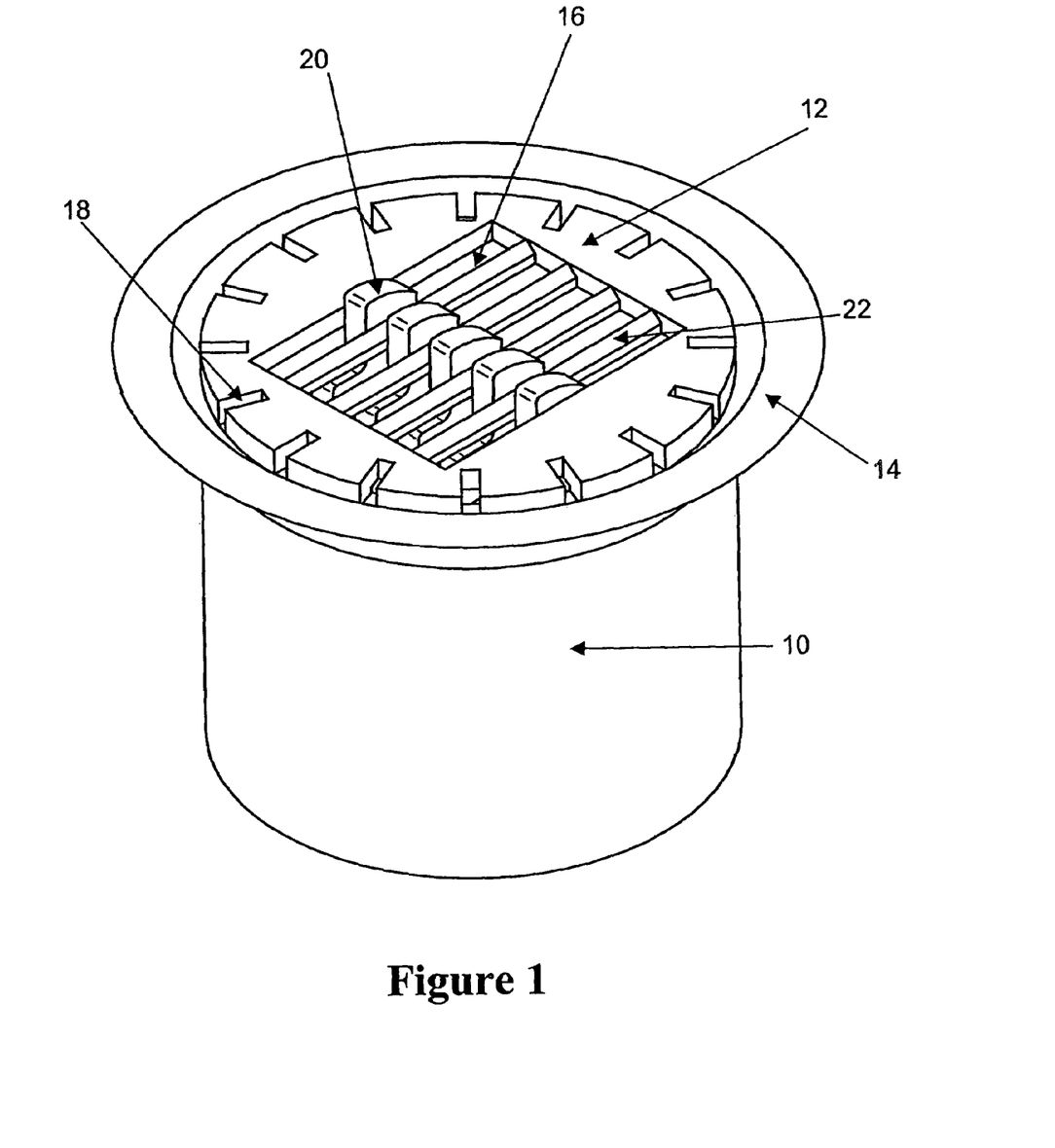
FIG. 1 shows an isometric view of a chip detachment apparatus according to the preferred embodiment of the invention.
Figure 2:
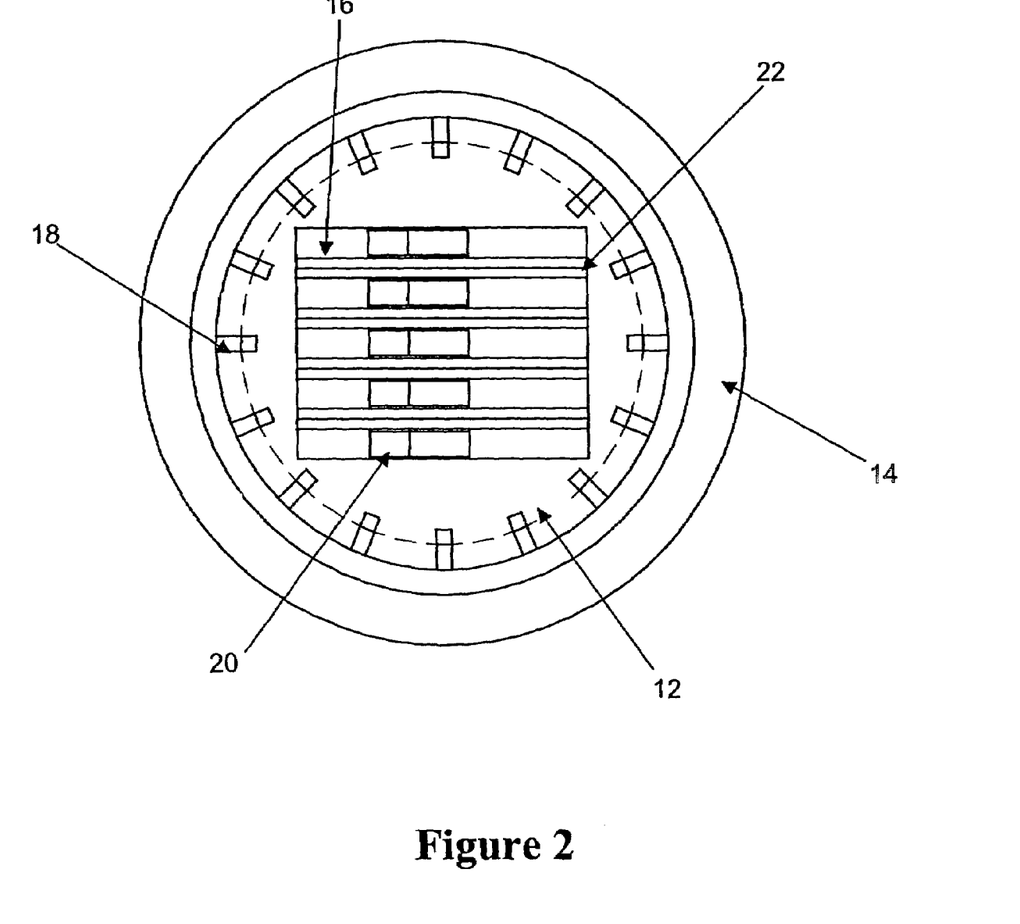
FIG. 2 shows a plan view of the chip detachment apparatus of FIG. 1.

FIG. 1 shows an isometric view of a chip detachment apparatus according to the preferred embodiment of the invention. FIG. 2 shows a plan view of the chip detachment apparatus of FIG. 1. The apparatus comprises generally of a retaining force generator in the form of a vacuum enclosure 10 coupled to a vacuum device, including a slotted vacuum platform 12 and an elevation device such as elevation tool 20 coupled to the vacuum platform 12. A rubber circular seal ring 14 around the top of the slotted vacuum platform 12 provides a vacuum seal for vacuum build-up along the interface between an adhesive tape holding a chip to be detached and the slotted vacuum platform 12 when the vacuum platform 12 is contacted with the adhesive tape.

A controllable vacuum suction is generated from a vacuum device (not shown) coupled to the vacuum platform 12 via the vacuum enclosure 10 and is conveyed to the said interface between the adhesive tape and vacuum platform via both vacuum slots 16 on the top of the platform 12 and a vacuum opening or vacuum openings 18 around the periphery of the platform 12. The vacuum devices serve to generate a retaining force on the adhesive tape, via vacuum suction, such that a portion of the adhesive tape at a position of the chip next to a straight vertical edge 26 of the elevation tool 20 is drawn in a direction away from the chip. The vacuum slots 16 comprise a plurality of slots extending across the surface of the vacuum platform 12. An elevation tool 20 with a plurality of finger-like projections is inserted underneath the vacuum slots 16 and inside the vacuum enclosure 10.

The said tool 20 is projectable from the surface of the vacuum platform 12 and can move up and down vertically as well as back and forth laterally relative to the vacuum slots 16 of the platform 12, which platform is positioned substantially stationary during a chip detachment process. The elevation tool 20 is therefore movable both laterally across the surface of the vacuum platform 12 and vertically with respect to the platform 12 for elevating a chip whereby to provide controlled lifting of the chip and propagation of delamination between the chip and the adhesive tape. The lateral motion of the elevation tool 20 across the surface of the vacuum platform 12 is preferably unidirectional. Preferably, the width of each vacuum slot 16 can only accommodate a single projection of the elevation tool 20. There is a ridge 22 separating two adjacent slots 16 from each other. The top part of each ridge 22 of the vacuum slot 16 on the platform 12 is preferably sharpened so that it provides a minimal supporting area underneath the chip and the adhesive tape.

Figure 3A:
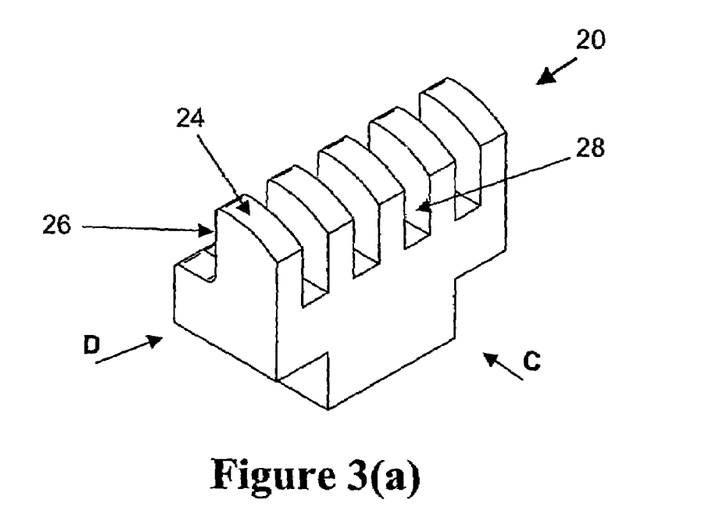
FIG. 3(a) shows an isometric view of an elevation tool of the chip detachment apparatus.
Figure 3B:
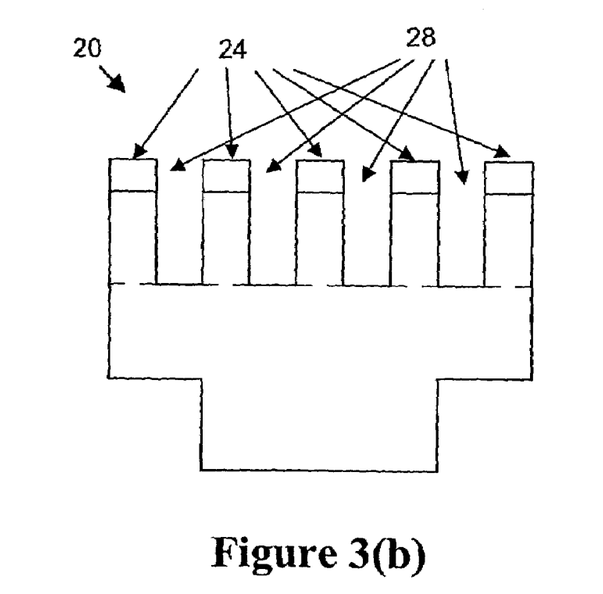
FIG. 3(b) shows a front view of the elevation tool of FIG. 3(a) looking from direction C of FIG. 3(a)
Figure 3C:
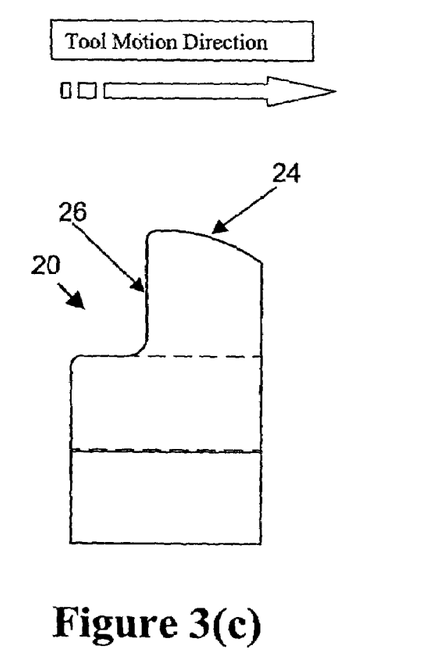
FIG. 3(c) shows a side view of the elevation tool of FIG. 3(a) looking from direction D of FIG. 3(a)

FIGS. 3(a) to (c) show more details of the elevation tool 20. The elevation tool 20 is adapted to move across the slotted vacuum platform 12 to provide a peeling action for detachment of a semiconductor chip 30 from the adhesive tape 32. The elevation tool 20 has a curved supporting surface 24 for elevating the semiconductor chip 30 and is programmed to move along an upward, sideways and downward profile across the vacuum platform 12. This lateral motion of the tool 20 produces a peeling force to detach the semiconductor chip 30 from the adhesive tape 32.

FIG. 3(a) shows an isometric view of the elevation tool of the chip detachment apparatus. The elevation tool 20 has three main features, namely, (i) a space 28 in-between each pair of finger-like projections, (ii) each projection includes a curved supporting surface 24 (preferably with a radius of curvature of more than 10 mm) on one side for lifting the chip 30, and (iii) a straight edge 26 at a trailing portion of each projection next to the curved supporting surface 24 that is substantially vertical for initiating delamination. FIG. 3(b) shows a front view of the elevation tool of FIG. 3(a) looking from direction C of FIG. 3(a), illustrating that the projections have spaces 28 in-between adjacent projections. FIG. 3(c) shows a side view of the elevation tool of FIG. 3(a) looking from direction D of FIG. 3(a). Each projection has a curved supporting surface 24 and a straight vertical edge 26. The motion direction of the tool 20 during the detachment process is such that the curved supporting surface 24 is used as the primary contact surface for elevating a chip as indicated in FIG. 3(c).

Figure 4A:
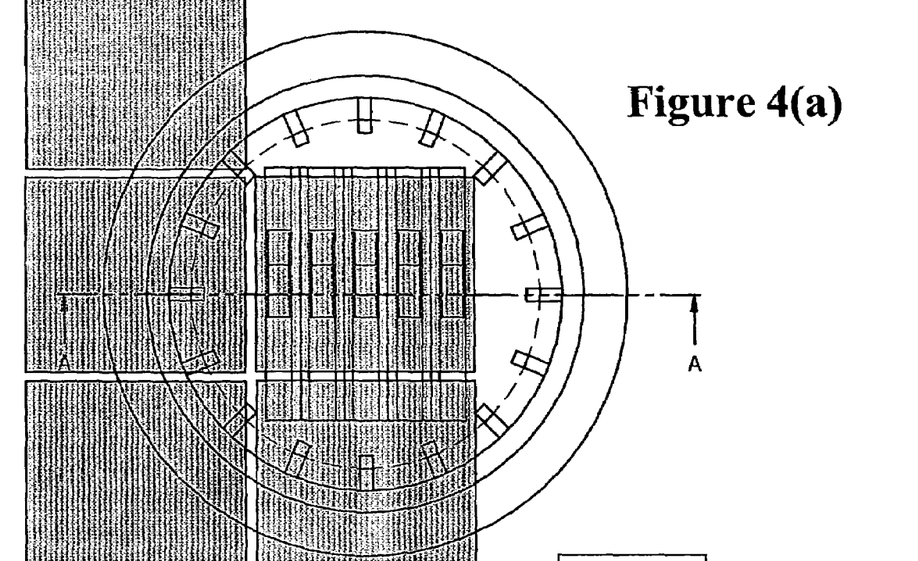
FIG. 4(a) shows a plan view of the chip detachment apparatus positioned underneath a plurality of semiconductor chips mounted on an adhesive tape.
Figure 4B:
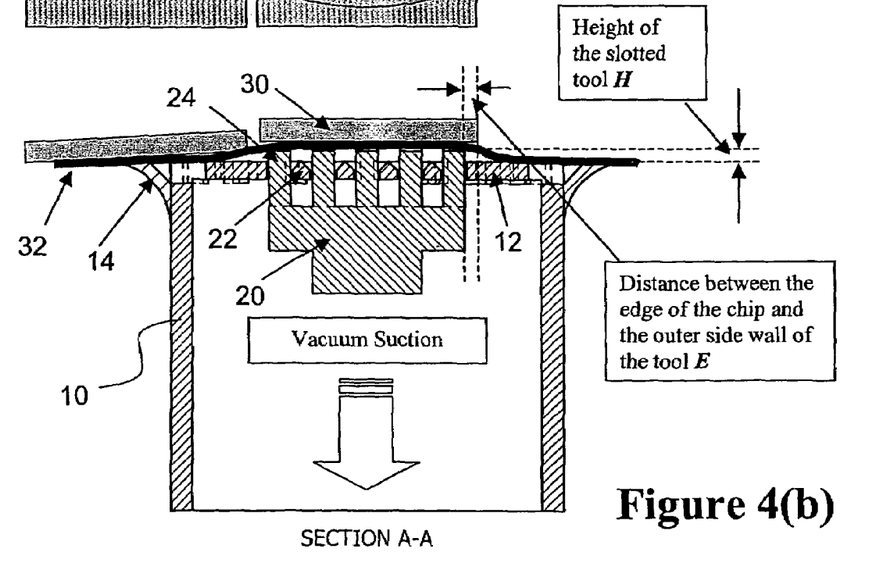
FIG. 4(b) shows a cross-sectional view of the apparatus and semiconductor chips looking along sectional line A-A of the plan view of FIG. 4(a)

FIG. 4(a) shows a plan view of the chip detachment apparatus positioned underneath a plurality of semiconductor chips 30 mounted on an adhesive tape 32. FIG. 4(b) shows a cross-sectional view of the apparatus and semiconductor chips 30 looking along sectional line A-A of the plan view of FIG. 4(a). The chip detachment process is implemented by first moving the elevation tool 20 to an initial rest position inside the slotted vacuum platform 12. The elevation tool 20 is moved up from its rest position to a predetermined height H (measured from the top of the vacuum platform as illustrated in FIG. 4(b)) at which the chip 30 is elevated from the platform 12. At the same time, the adhesive tape 32 should be retained held down onto the platform 12 by vacuum suction induced in the vacuum enclosure 10. The tool height H at this point and when the elevation tool 20 is moving laterally across the platform 12 should preferably be greater than a certain critical value Hc at which delamination between the chip 30 and the adhesive tape 32 would tend to occur.

Figure 5:
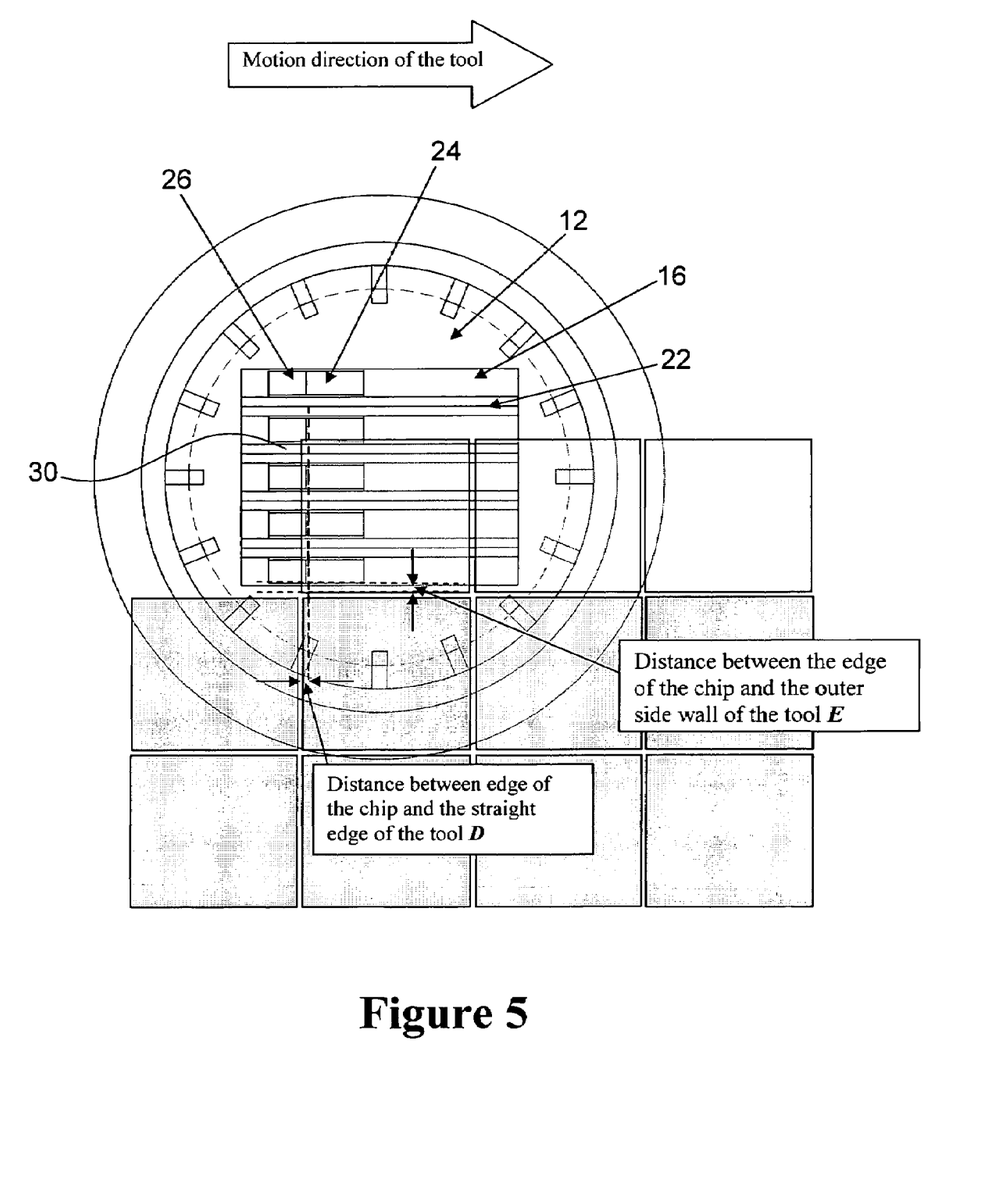
FIG. 5 shows a plan view of the chip detachment apparatus at the beginning of a sweep motion for delaminating a chip when the elevation tool is at its initial position.

FIG. 5 shows a plan view of the chip detachment apparatus at the beginning of a sweep motion for delaminating a chip from the adhesive tape 32 when the elevation tool 20 is at its initial position. At the beginning of the detachment process, as the elevation tool 20 is raised beyond a critical height Hc, the adhesive tape 32 will start delaminating from the chip 30. The value of the critical height Hc is typically dependent on (i) the adhesion strength of the adhesive tape 32 to the chip 30, (ii) the distance D of the straight edge 26 of the elevation tool 20 from the edge of the semiconductor chip 30 when the elevation tool 20 is at its initial position as illustrated in FIG. 5, (iii) the strength of the vacuum suction and ultimate vacuum level provided by the vacuum enclosure, and (iv) the thickness and Young's modulus of the chip 30. The chip 30 being detached is completely supported by the elevation tool 20 at the position of contact as indicated in FIG. 4.

The distance between the edge of the semiconductor chip 30 and an outer side wall of the elevation tool E is illustrated in both FIG. 4 and FIG. 5. The upper value of E is preferably within the range of a critical distance Dc, which is the maximum distance between the edge of the chip and a straight edge of the tool 20 for setting up the initial position of the elevation tool 20 before it is elevated from the vacuum platform 12. The critical distance Dc is determinable mainly by the adhesive strength of the tape 32 and the tool height H.

Delamination will propagate along the interface between the chip 30 and adhesive tape 32 when the elevation tool 20 moves across the chip 30. The speed of this sweep motion of the elevation tool 20 at which the tool 20 is moving laterally across the vacuum platform 12 is programmed to a value that is less than the propagation speed of the said delamination. Otherwise, the chip 30 may still stick to the adhesive tape 32 although it has been elevated by the elevation tool 20, or sometimes, crack chip failure may occur.

Figure 6A:
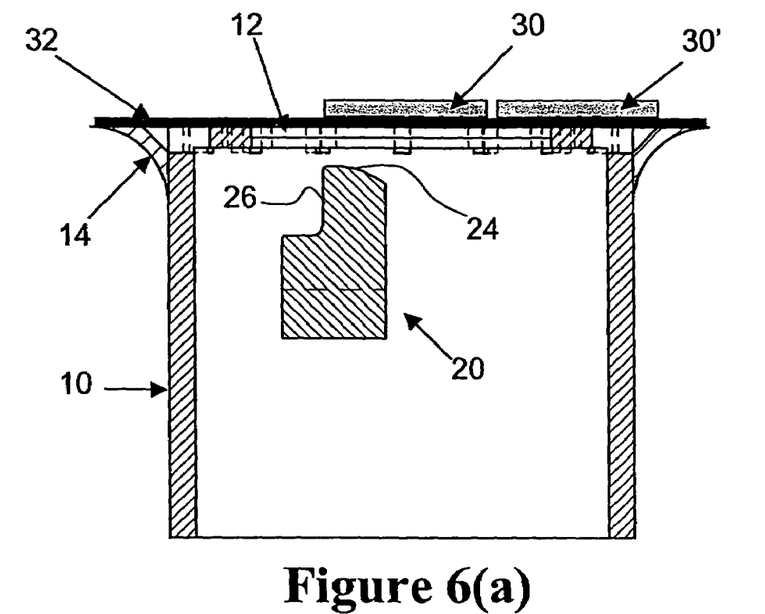
FIG. 6(a) to (h) show cross-sectional views of the respective positions of the elevation tool as the tool sweeps across a semiconductor chip and pushes the chip from underneath the adhesive tape to which the chip is mounted.

FIGS. 6(a) to (h) show cross-sectional views of the respective positions of the elevation tool 20 as the tool sweeps across a semiconductor chip 30 and pushes the chip 30 from underneath the adhesive tape 32 to which the chip is mounted. They illustrate the motion profile and motion steps of the elevation tool 20 as well as its corresponding process actions for a chip having a width of approximately 15 mm. The motion of the elevation tool 20 in the chip detachment process is composed primarily of the following motion steps:

In FIG. 6(a), the elevation tool 20 stays at its rest height level and initial horizontal position at a rest position underneath the surface of the vacuum platform 12.

Figure 6B:
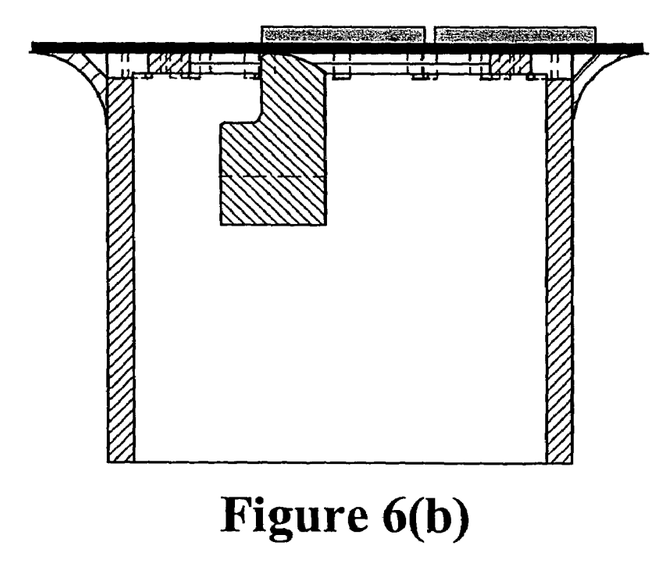

In FIG. 6(b), the elevation tool 20 rises to its standby height level from its initial horizontal position where the supporting surface is just underneath the adhesive tape 32. The initial position of the tool should be set in a way that the distance D between the straight edge of the tool and the edge of the chip is less than its critical value Dc. The critical value Dc may be in the order of about 1.0 mm.

Figure 6C:
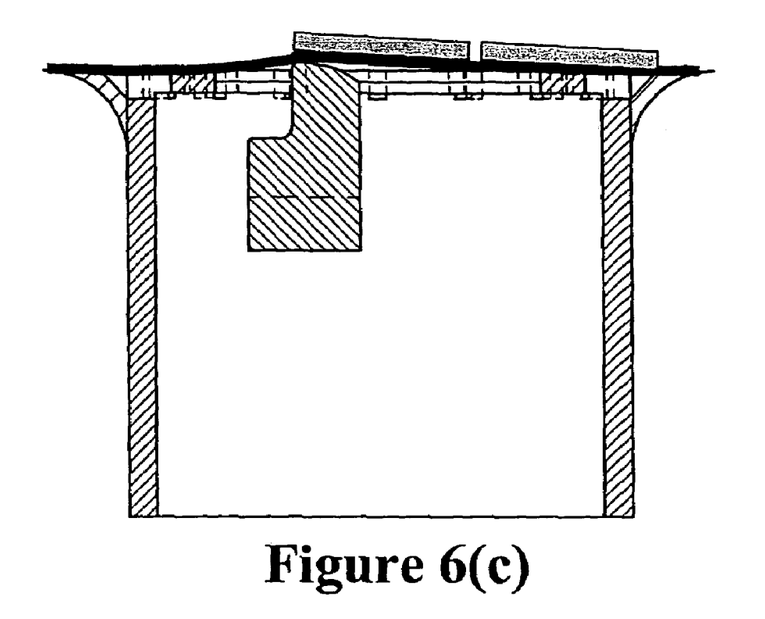

In FIG. 6(c), the vacuum suction provided by the vacuum enclosure 10 is switched on. The elevation tool 20 remains at the same standby horizontal position but rises to an elevated height level which is greater than critical height Hc to initiate the delamination of the adhesive tape 32 from the chip 30 with the help of the vacuum suction provided by the vacuum enclosure 10. The critical height Hc of the tool may be in the order of about 0.3 mm.

Figure 6D:
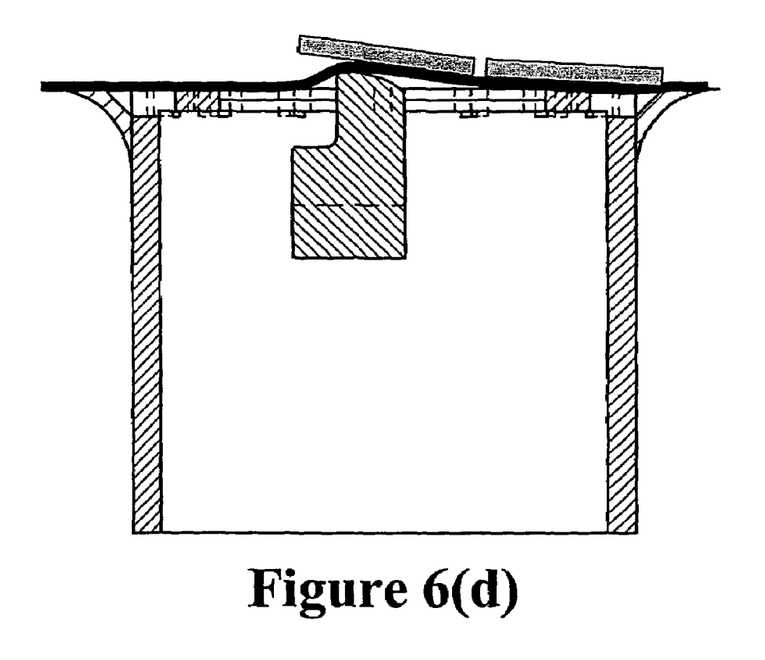

In FIG. 6(d), after the delamination between the adhesive tape 32 from the chip 30 starts to propagate (its propagation will be limited by the location of the elevation tool), the elevation tool 20 will move laterally in the horizontal direction along the slot 16 towards a final location at an opposite edge of the chip 30. Delamination will propagate and follow the motion of the elevation tool 20. The motion speed of the tool should not exceed the propagation rate of the delamination between the semiconductor chip 30 and the adhesive tape 32. The elevation tool 20 may optionally simultaneously continue moving up to a higher predetermined height H to further shorten the time needed for delamination propagation.

Figure 6E:
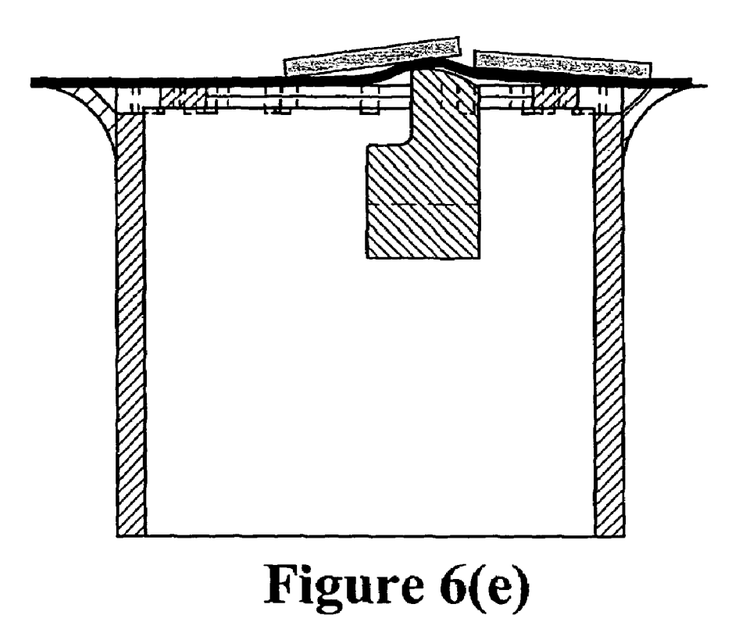

In FIG. 6(e), the elevation tool 20 will stay at a raised height H (greater than Hc) and continue moving in the horizontal direction across the chip 30. As the tool 20 moves along, the end of its curved surface 24 may encroach into the chip 30' next to the one that is being detached. At this point, the elevation tool 20 should thus start descending to a lower final height, which should also be greater than the critical height Hc, to minimize any pressure exerted on the adjacent chip 30.

Figure 6F:
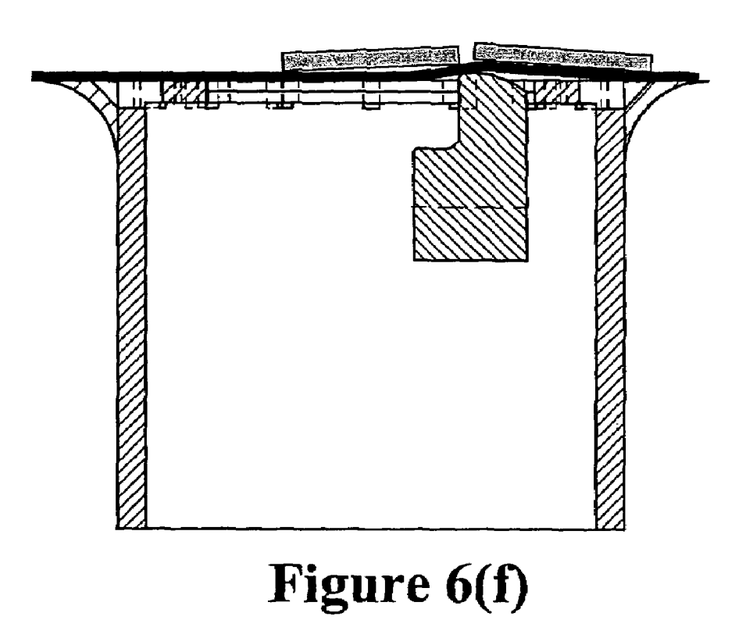

In FIG. 6(f), the elevation tool moves down from its predetermined height H to the final raised height (which is greater than Hc) as it arrives at the final horizontal position upon reaching the opposite end of the chip 30.

Figure 6G:
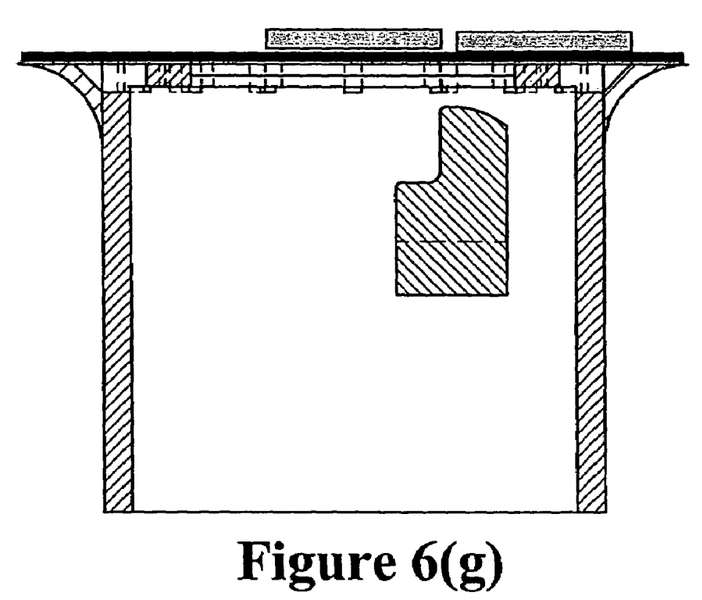

In FIG. 6(g), at the end of the sweep motion, the elevation tool moves all the way down to its height level at rest at its final horizontal position that is underneath the surface of the vacuum platform 12. Strong vacuum suction is applied to ensure that the detached adhesive tape 32 is retained or held down into the slots 16 of the vacuum platform 12 and is separated from the chip 30.

Figure 6H:
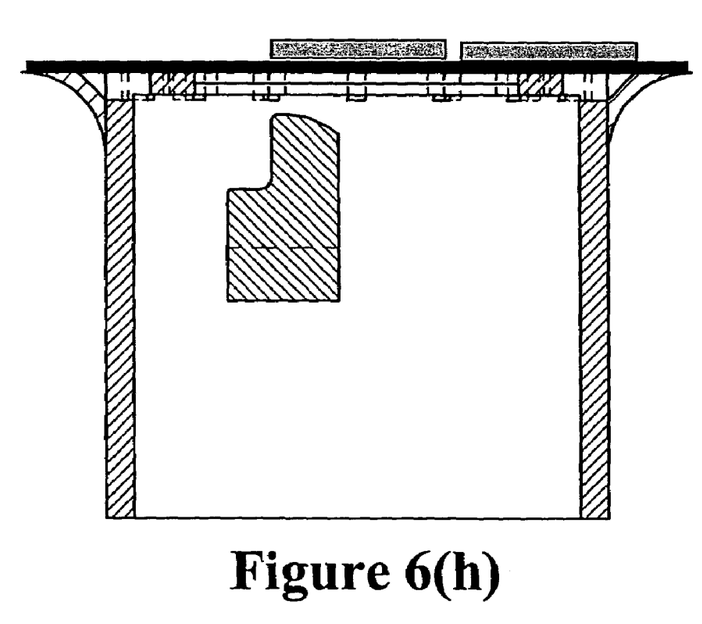

In FIG. 6(h), the elevation tool 20 will move back to the initial horizontal position underneath the vacuum platform 12 at its height at rest.

Figure 7A:
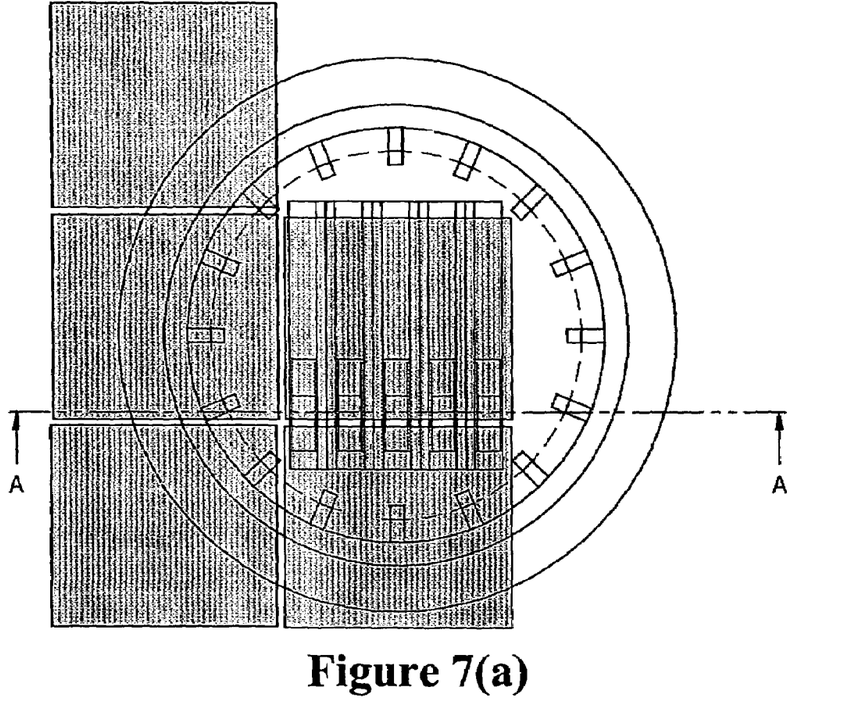
FIG. 7(a) shows a plan view of the chip detachment apparatus at the end of the sweep motion of the elevation tool when the elevation tool has descended below the slotted vacuum platform.
Figure 7B:
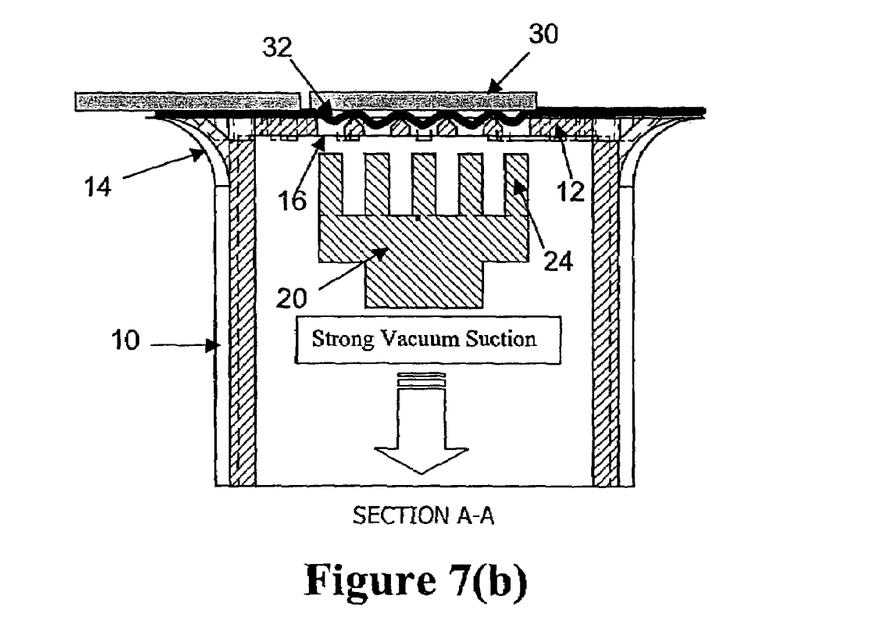
FIG. 7(b) shows a cross-sectional view looking along sectional line A-A of FIG. 7(a)

FIG. 7(a) shows a plan view of the chip detachment apparatus at the end of the sweep motion of the elevation tool when the elevation tool has descended below the slotted vacuum platform. FIG. 7(b) shows a cross-sectional view looking along sectional line A-A of FIG. 7(a). At the end of the sweep motion of the elevation tool 20, the elevation tool 20 will descend below the vacuum platform 12. The chip 30 is substantially detached from the adhesive tape 32 while being supported by the ridges 22 of the vacuum slots 16 of the vacuum platform 12. Since the adhesive tape 32 is held down into the slots 16 of the platform 12 by strong vacuum suction, only parts of the adhesive tape corresponding to the positions of the sharp ridges 22 of the slots 16 remain in contact with the chip 30. Therefore, there is minimal contact between the chip 30 and the adhesive tape 32 and, since the interfacial adhesion has been substantially decreased, the detached chip 30 is ready to be picked by a pick-head of a pickup tool (not shown).

Figure 8:
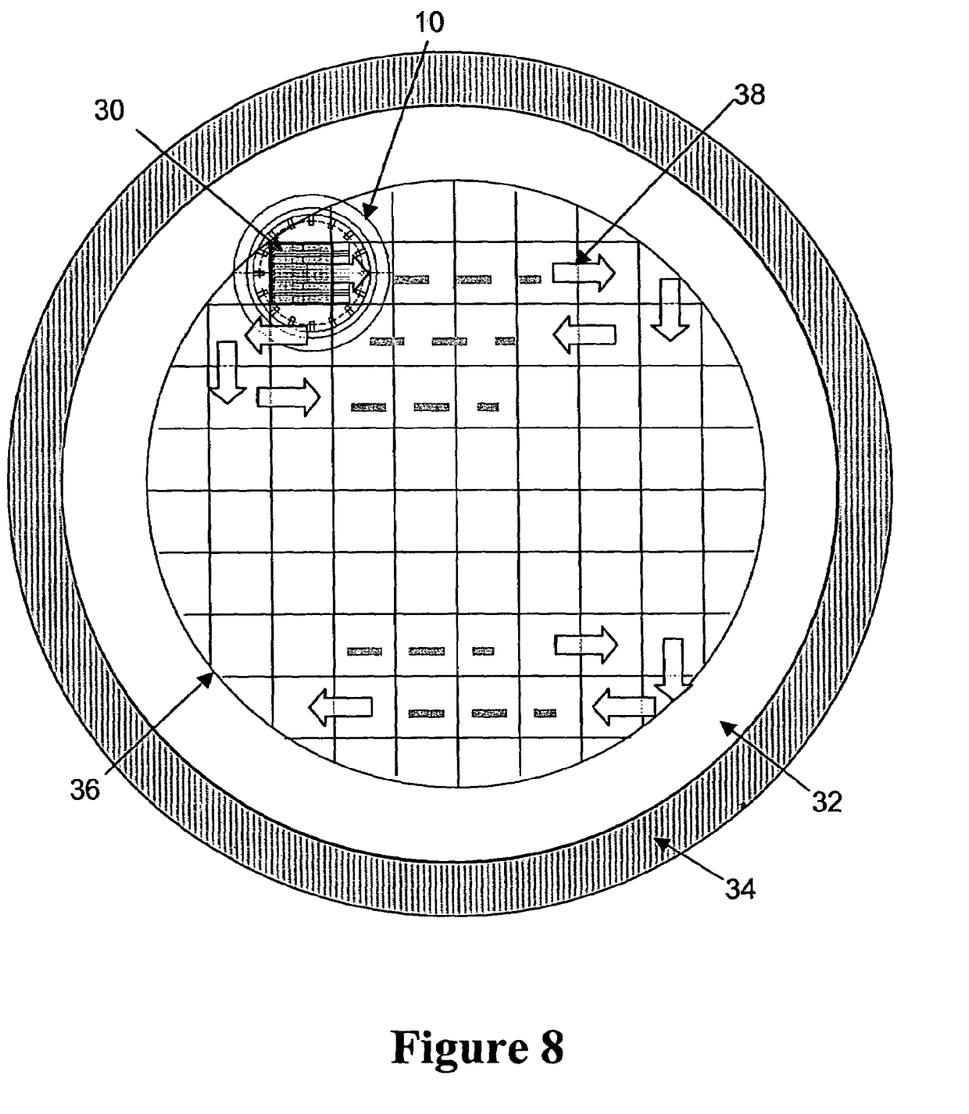
FIG. 8 shows an example of a pickup sequence that can be employed for picking up a plurality of chips from a wafer using the chip detachment apparatus of the present invention.

FIG. 8 shows an example of a pickup sequence that can be employed for picking up a plurality of chips 30 from a wafer 36 using the chip detachment apparatus of the present invention. The wafer 36 comprising a plurality of semiconductor chips 30 is mounted onto an adhesive tape 32, which is in turn carried by a wafer frame 34. In this set-up, the described embodiment of the present invention is designed to be used with an automatic pick and place machine so that singulated semiconductor chips 30 of a wafer 36 can be detached from the adhesive tape 32. The width of the elevation tool 20 that is substantially perpendicular to a direction of travel of the elevation tool 20 is larger than the width of the chip 30.

The pickup sequence starts from a corner of the wafer 36 from one side thereof and the chip detachment apparatus moves along rows of semiconductor chips 30 in the predetermined pickup directions marked by arrows 38 in FIG. 8. Generally, each chip 30 comprised in a row of chips is picked up in a first direction, and each chip 30 in an adjacent row of chips is picked up in an opposite direction to the first direction. Each chip in a row of semiconductor chips 30 comprised in the wafer 36 is picked up in a sequential order until all the usable chips 30 are picked up from the wafer 36.

It would be appreciated that the small footprint and cylindrical shape of the vacuum enclosure 10 allows a user of the aforesaid chip detachment apparatus to maximize the useable pickup area of the wafer within the wafer ring when the apparatus is mounted on an automatic pick and place machine. Another advantage of the apparatus is that a reduced bending stress is induced on the semiconductor chip to induce delamination between the semiconductor chip and the adhesive tape. Detachment of a very thin chip from both UV and non-UV dicing adhesive tapes is thus possible.

A significant benefit of the apparatus over the prior art is that it can be applied to a larger range of sizes of semiconductor chips without any, or any significant tooling changes. This is because, using the aforesaid pickup sequences as described in relation to FIG. 8, a different tooling need not be made or employed for a different size of chips. The width of the elevation tool may even be larger than the width of the chip. The apparatus can thus be programmable to cater for different sizes of chips 30.

It would also be appreciated that since the delamination between the chip and the adhesive tape is led and initiated by the motion of the elevation tool, the propagation rate of the delamination is controllable by adjusting the height and horizontal motion speed of the tool. The propagation rate of the delamination can be therefore easily optimized to achieve maximum throughput and minimum crack chip failure.

Moreover, a further benefit of the apparatus according to the preferred embodiment of the invention is that, unlike certain prior art devices, the chip can be delaminated from the adhesive tape without the presence of a pickup tool placed on top of the chip while the chip is being delaminated. This can sometimes increase throughput of a pick and place machine if the chip detachment process is slow, because the pickup collet can be free to perform placement of another chip as the chip detachment process of one chip is in progress.

The invention described herein is susceptible to variations, modifications and/or additions other than those specifically described and it is to be understood that the invention includes all such variations, modifications and/or additions which fall within the spirit and scope of the above description.

The invention claimed is:

1. Apparatus for detaching a semiconductor chip from an adhesive tape on which the chip is mounted, comprising:
   a platform configured to contact the adhesive tape at a position of the chip;
   a retaining force generator coupled to the platform for drawing the adhesive tape at the position of the chip in a direction away from the chip; and
   an elevation device projectable from the platform, the elevation device being operable to move both laterally across a surface of the platform to the position of the chip and vertically with respect to the platform at the position of the chip for elevating the chip and to provide controlled lifting of the chip and propagation of delamination between the chip and the adhesive tape, wherein the elevation device is operative to simultaneously move laterally and vertically at the position of the chip.

2. Apparatus as claimed in claim 1, wherein the retaining force generator comprises a vacuum device coupled to the platform to generate a vacuum suction force at the platform.

3. Apparatus as claimed in claim 2, including a plurality of slots extending across the surface of the platform through which vacuum suction force may be generated.

4. Apparatus as claimed in claim 3, wherein the elevation device is projectable from the surface of the platform through the slots.

5. Apparatus as claimed in claim 3, including a ridge having a sharpened top surface and shaped and positioned for separating two adjacent slots from each other.

6. Apparatus as claimed in claim 5, wherein the ridge is configured to support the adhesive tape drawn by the retaining force generator after delamination of the adhesive tape.

7. Apparatus as claimed in claim 3, wherein the elevation device comprises a plurality of projections and a space between adjacent projections, and each slot is configured to accommodate one projection that is projectable from the surface of the platform.

8. Apparatus as claimed in claim 1, wherein the elevation device includes a curved support surface for lifting the chip.

9. Apparatus as claimed in claim 1, wherein the elevation device includes a straight edge that is substantially vertical at a trailing portion of the elevation device for initiating delamination between the chip and the adhesive tape.

10. Apparatus as claimed in claim 1, wherein a supporting surface of the elevation device is operable to move laterally across the platform at a height or heights that are higher than a critical height at which delamination between the chip and adhesive tape tends to occur at the position of the supporting surface.

11. Apparatus as claimed in claim 1, wherein the elevation device is operable to move laterally across the platform at a speed less than a propagation speed of delamination between the chip and the adhesive tape.

12. Apparatus as claimed in claim 1, wherein the elevation device has a width that is substantially perpendicular to a direction of travel of the elevation device and that is substantially the same as or larger than a width of the chip.

13. Apparatus as claimed in claim 1, wherein the elevation device has a rest position underneath the surface of the platform.

14. Apparatus as claimed in claim 1, wherein the elevation device is configured to move underneath the surface of the platform after traversing across the platform.

15. Apparatus as claimed in claim 1, wherein the elevation device is positioned to be operable to move to project above the platform.

16. Apparatus as claimed in claim 1, wherein the elevation device is positioned to be operable to move to project above the platform and through the platform.

* * * * *